United States Patent
Nishimura et al.

(10) Patent No.: US 12,494,404 B2
(45) Date of Patent: Dec. 9, 2025

(54) SEMICONDUCTOR DEVICE INCLUDING STOP ISLANDS AND METHOD FOR MANUFACTURING SEMICONDUCTOR DEVICE

(71) Applicant: Mitsubishi Electric Corporation, Tokyo (JP)

(72) Inventors: Kunihiko Nishimura, Tokyo (JP); Masahiro Fujikawa, Tokyo (JP); Shuichi Hiza, Tokyo (JP); Shinya Nishimura, Tokyo (JP); Ken Imamura, Tokyo (JP); Yuki Takiguchi, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 470 days.

(21) Appl. No.: 17/918,907

(22) PCT Filed: May 25, 2020

(86) PCT No.: PCT/JP2020/020553
§ 371 (c)(1),
(2) Date: Oct. 14, 2022

(87) PCT Pub. No.: WO2021/240603
PCT Pub. Date: Dec. 2, 2021

(65) Prior Publication Data
US 2023/0238296 A1    Jul. 27, 2023

(51) Int. Cl.
*H01L 23/31* (2006.01)
*H01L 21/56* (2006.01)
(Continued)

(52) U.S. Cl.
CPC .......... *H01L 23/3192* (2013.01); *H01L 21/56* (2013.01); *H10D 62/40* (2025.01); *H10D 62/8303* (2025.01); *H01L 2223/5446* (2013.01)

(58) Field of Classification Search
CPC ....... H01L 2221/68327; H01L 21/3043; H01L 24/96; H01L 2224/96; H01L 21/78;
(Continued)

(56) References Cited

U.S. PATENT DOCUMENTS

| 6,613,461 B1 | 9/2003 | Sugahara |
| 2004/0009649 A1 | 1/2004 | Kub et al. |

(Continued)

FOREIGN PATENT DOCUMENTS

| CN | 102446865 A | 5/2012 |
| JP | 2001-168388 A | 6/2001 |

(Continued)

OTHER PUBLICATIONS

Office Action issued Dec. 19, 2024 in Chinese Patent Application No. 202080101066.3, 13 pages.
(Continued)

*Primary Examiner* — Steven B Gauthier
*Assistant Examiner* — Candice Chan
(74) *Attorney, Agent, or Firm* — XSENSUS LLP

(57) ABSTRACT

A split in a dicing street in a semiconductor film is prevented. A semiconductor device includes: a first dicing street passing between a plurality of element regions on which a plurality of protective films are formed one-to-one, the first dicing street extending along a first axis; a second dicing street passing between the plurality of element regions and extending along a second axis; and a stop island disposed on the upper surface of the semiconductor film at an intersection between the first dicing street and the second dicing street, the stop island being in non-contact with the plurality of element regions. $X\_si > X\_ds$ and $Y\_si < Y\_ds$ are satisfied.

14 Claims, 11 Drawing Sheets

(51) Int. Cl.
*H10D 62/40* (2025.01)
*H10D 62/83* (2025.01)

(58) Field of Classification Search
CPC ............ H01L 2223/5446; H10D 89/10; H10D 89/011–015
See application file for complete search history.

(56) References Cited

U.S. PATENT DOCUMENTS

| | | | |
|---|---|---|---|
| 2010/0072578 A1* | 3/2010 | Kunishima | ........... H01L 23/585 |
| | | | 257/E23.179 |
| 2012/0080673 A1 | 4/2012 | Winter | |
| 2014/0167225 A1 | 6/2014 | Winter | |
| 2015/0162219 A1 | 6/2015 | Terai et al. | |
| 2017/0066078 A1 | 3/2017 | Morikazu et al. | |
| 2018/0269162 A1 | 9/2018 | Takahashi et al. | |

FOREIGN PATENT DOCUMENTS

| | | |
|---|---|---|
| JP | 2011-138856 A | 7/2011 |
| JP | 2016-198788 A | 12/2016 |
| JP | 2018-157022 A | 10/2018 |
| WO | 2014/009997 A1 | 1/2014 |

OTHER PUBLICATIONS

International Search Report and Written Opinion mailed on Aug. 25, 2020, received for PCT Application PCT/JP2020/020553, filed on May 25, 2020, 10 pages including English Translation.

Office Action and Search Report issued May 13, 2025 in corresponding Chinese patent application No. CN 202080101066.3 (16 pages; with English translation).

Decision of Refusal issued Sep. 10, 2025 in corresponding Chinese patent application No. 202080101066.3 (14 pages; with English translation).

* cited by examiner

SEMICONDUCTOR DEVICE INCLUDING STOP ISLANDS AND METHOD FOR MANUFACTURING SEMICONDUCTOR DEVICE

CROSS-REFERENCE TO RELATED APPLICATION

The present application is based on PCT filing PCT/JP2020/020553, filed May 25, 2020, the entire contents of which is incorporated herein by reference.

TECHNICAL FIELD

The technology disclosed in this DESCRIPTION relates to a semiconductor device and a method for manufacturing the semiconductor device.

BACKGROUND ART

High electron mobility transistors (i.e., HEMTs) each including a gallium nitride (GaN) film as an active layer have been put to practical use as high-output and high-frequency transistors.

The devices can achieve high withstand voltages through the use of the active layers made of GaN, and can further achieve low resistance through the use of the HEMT structure. Thus, high power can be applied to the devices.

However, Joule heat generated in transistor components upon application of the high power may cause problems such as a decrease in element performance or destruction of elements.

Normally, high-output transistors include heat dissipating components called heat sinks. Since a heated portion is limited to a micro region in a transistor, the problem is how to transport the heat from the heated portion that is the micro region to the heat sink.

A GaN thin film in which a transistor is formed is bonded to a heat sink through a silicon carbide (SiC) substrate that is a base material of the GaN thin film. Recent years have seen proposals of a structure including a GaN thin film made of diamond higher in thermal conductivity instead of SiC.

When diamond is used as a base material of the GaN thin film, the heat generated in the micro region of the GaN thin film diffuses through a diamond layer in an extension direction of the base material. Thus, the use of a heat sink in a wider range can distribute the heat dissipation effect. Consequently, an end-point temperature in the heated portion can be reduced.

The following describes an example method for forming a HEMT including a GaN thin film made of diamond as a base material.

Specifically, a GaN thin film is crystal grown on a Si substrate or a SiC substrate. Then, an insulating film is formed on an upper surface of the GaN thin film. The HEMT structure is completed further through an electrode formation process.

Then, the HEMT structure is sealed by, for example, a resin layer, and then bonded to a supporting substrate. Further, the Si substrate or the SiC substrate is removed. A heavy smoothing process is performed on the exposed GaN thin film for preparing a process of bonding the GaN thin film to diamond.

Next, a heavy smoothing process is performed on a surface of a diamond substrate to be separately prepared for performing a process of bonding the diamond substrate to the GaN thin film.

Further, removal of the supporting substrate completes a GaN transistor including the diamond substrate as a base material. The GaN transistor is singulated into pieces, for example, through dicing, and bonded to a heat sink.

The insulating film sometimes peels off from a probable chipped portion (a fracture or a crack, etc., in a semiconductor layer) in the dicing as a starting point. The portion in which the insulating film peels off extends to element regions, and sometimes causes an element failure.

To prevent such malfunctions, the insulating film needs to be removed in advance in dicing streets that are formed along dicing lines cut in the dicing and are regions wider than the dicing lines (see, for example, Patent Document 1 or 2). In other words, no insulating film is formed in the dicing streets, and only a GaN thin film is formed on the diamond substrate in the regions.

PRIOR ART DOCUMENTS

Patent Documents

Patent Document 1: WO2014/009997
Patent Document 2: Japanese Patent Application Laid-Open No. 2011-138856

SUMMARY

Problem to be Solved by the Invention

In the dicing streets, the GaN thin film sometimes splits due to the stress applied to the GaN thin film during processes of fabricating a transistor.

The GaN thin film which has been crystal grown on a Si substrate or a SiC substrate often has stress by nature. If the adhesion with a substrate or the adhesion with a film further laminated on the GaN thin film (e.g., an insulating film), and a coefficient of elasticity of the insulating film itself are high, the GaN thin film does not split even with the stress.

However, in the dicing streets where the GaN thin film loses adhesion with the upper layer due to the removal of the insulating film, the GaN thin film also loses adhesion with the substrate through a process of removing the Si substrate or the SiC substrate as in the method for forming the HEMT. Thus, the GaN thin film in the dicing streets tends to split.

Patent Document 1 discloses a semiconductor device including island-shaped stress relaxation resin layers disposed at intersections with dicing streets to overlay element regions.

According to Patent Document 1, the stress relaxation layers made of a resin can prevent peeling caused by the heat cycle, between a sealing resin sealing singulated semiconductor chips and the semiconductor chips.

However, since the stress relaxation layers are resin layers according to Patent Document 1, the layers are typically lower in coefficient of elasticity. Thus, when the GaN thin film splits, this merely induces a split in the resin layers. Thus, a split in the GaN thin film cannot fully be prevented.

Furthermore, Patent Document 2 discloses a semiconductor device including stoppers at intersections with dicing streets.

According to Patent Document 2, when a surface opposite to a device surface is ground with a protection tape being attached to the device surface, the stoppers can prevent infiltration of abrasive water due to adhesion failures between the dicing streets and the protection tape.

However, both of an x-axis projected dimension and a y-axis projected dimension of the stopper are larger than those of the dicing street according to Patent Document 2. Thus, a narrower portion both in the x-axis direction and the y-axis direction is created between the stopper and the element region. In such a narrower portion between the stopper and the element region, the GaN thin film tends to split.

The technology disclosed in this DESCRIPTION has been conceived in view of the aforementioned problems, and is a technology for preventing a split in a dicing street in a semiconductor film.

Means to Solve the Problem

A first aspect of the technology disclosed in this DESCRIPTION relates to a semiconductor device including: a semiconductor film formed on an upper surface of a substrate; a plurality of protective films partially formed on an upper surface of the semiconductor film; a first dicing street passing between a plurality of element regions on which the plurality of protective films are formed one-to-one, the first dicing street extending along a first axis in a plan view; a second dicing street passing between the plurality of element regions and extending along a second axis crossing the first axis in the plan view; and a stop island disposed on the upper surface of the semiconductor film at an intersection between the first dicing street and the second dicing street, the stop island being in non-contact with the plurality of element regions, wherein assuming that $X\_si$ denotes a projected dimension of the stop island to the first axis, $Y\_si$ denotes a projected dimension of the stop island to the second axis, $X\_ds$ denotes a projected width of the second dicing street to the first axis, and $Y\_ds$ denotes a projected width of the first dicing street to the second axis, $X\_si > X\_ds$ and $Y\_si < Y\_ds$ are satisfied.

A second aspect of the technology disclosed in this DESCRIPTION relates to a method for manufacturing a semiconductor device, the method including: forming a semiconductor film on an upper surface of a substrate; forming a protective film on an upper surface of the semiconductor film; partially removing the protective film to separate the protective film into a plurality of element regions, and forming a first dicing street extending along a first axis in a plan view; forming a second dicing street extending along a second axis crossing the first axis in the plan view, during the partial removal of the protective film for separating the protective film into the plurality of element regions; and forming a stop island disposed on the upper surface of the semiconductor film at an intersection between the first dicing street and the second dicing street, the stop island being in non-contact with the plurality of element regions, wherein assuming that $X\_si$ denotes a projected dimension of the stop island to the first axis, $Y\_si$ denotes a projected dimension of the stop island to the second axis, $X\_ds$ denotes a projected width of the second dicing street to the first axis, and $Y\_ds$ denotes a projected width of the first dicing street to the second axis, $X\_si > X\_ds$ and $Y\_si < Y\_ds$ are satisfied.

Effects of the Invention

According to the first aspect of the technology disclosed in the DESCRIPTION, even when the semiconductor device is diced across the stop islands, peeling of the protective films can be prevented from reaching the element regions. Moreover, the propagation of the split in the dicing street can be effectively prevented.

According to the second aspect of the technology disclosed in the DESCRIPTION, even when the semiconductor device is diced across the stop islands, peeling of the protective films can be prevented from reaching the element regions. Moreover, the propagation of the split in the dicing street can be effectively prevented.

The object, features, aspects, and advantages related to the technology disclosed in the DESCRIPTION will become more apparent from the following detailed description and the accompanying drawings.

DESCRIPTION OF EMBODIMENTS

Figure 1:
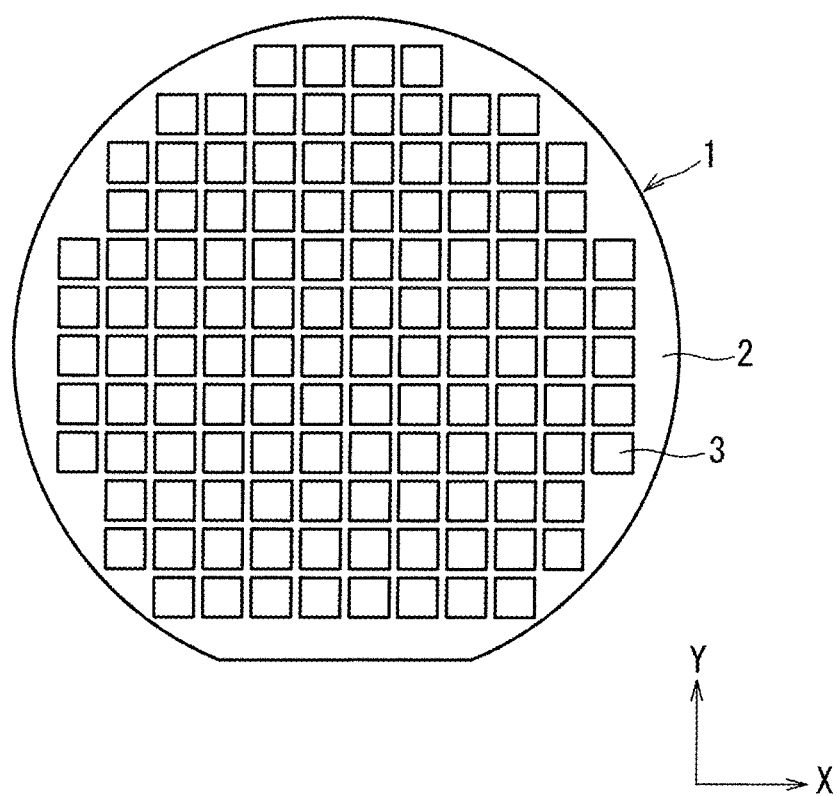
FIG. 1 is a top view schematically illustrating an example structure of a semiconductor device according to an embodiment.

Hereinafter, Embodiments will be described with reference to the accompanying drawings. Although detailed features are described for description of the technology in Embodiments below, they are mere exemplification and not necessarily essential features for making Embodiments feasible.

Note that the drawings are drawn in schematic form, and the structures in the drawings are appropriately omitted or simplified for convenience of the description. The mutual relationships in size and position between the structures in the different drawings are not necessarily accurate but may be appropriately changed. The drawings such as not cross-sectional views but plan views are sometimes hatched for facilitating the understanding of the details of Embodiments.

In the following description, the same reference numerals are assigned to the same constituent elements, and their names and functions are the same. Therefore, detailed description of such constituent elements may be omitted to avoid redundant description.

Unless otherwise specified, an expression "comprising", "including", or "having" a certain constituent element is not an exclusive expression for excluding the presence of the other constituent elements in the following description.

The ordinal numbers such as "first" and "second" in the following description are used for convenience to facilitate the understanding of the details of Embodiments. The order indicated by these ordinal numbers does not restrict the details of Embodiments.

Unless otherwise specified, the expressions indicating relative or absolute positional relationships, for example, "in one direction", "along one direction", "parallel", "orthogonal", "central", "concentric", and "coaxial" include those exactly indicating the positional relationships and those where an angle or a distance is relatively changed within tolerance or to the extent that similar functions can be obtained.

Unless otherwise specified, the expressions indicating equality, for example, "same", "equal", "uniform", and "homogeneous" include those indicating quantitatively exact equality and those in the presence of a difference within tolerance or to the extent that similar functions can be obtained.

In the following description, even when terms expressing a particular position and a particular direction such as "up", "down", "left", "right", "side", "bottom", "front", or "back" are used, these terms are used for convenience to facilitate the understanding of the details of Embodiments, and do not relate to positions or directions that are actually used.

In the following description, the expression of, for example, "an upper surface of" or "a lower surface of" a target element includes states where not only the upper surface or the lower surface of the element itself is formed but also another element is formed on the upper surface or the lower surface of the target element. Specifically, for example, the expression "Y formed on the upper surface of X" does not prevent interposition of another element "Z" between. X and Y.

Unless otherwise specified, the expressions indicating shapes, for example, "rectangular" or "cylindrical" include those indicating geometrically exact shapes and those indicating roughness or a chamfer within tolerance or to the extent that similar functions can be obtained.

Embodiment 1

A semiconductor device according to Embodiment 1, and a method for manufacturing the semiconductor device will be hereinafter described.

High electron mobility transistors (HEMTs), which have been put to practical use as transistors that can perform high-output and high-frequency operations, can achieve high withstand voltages through the use of the active layers made of gallium nitride (GaN), and can further achieve low resistance through the use of the HEMT structure.

However, it is difficult to manufacture plate-shaped single-crystalline substrates made of GaN. Thus, substrates each formed by hetero-epitaxially growing a GaN thin film on an upper surface of a heterogeneous substrate, for example, a silicon carbide (SiC) substrate, a silicon (Si) substrate, or a sapphire ($Al_2O_3$) substrate are used instead.

Here, GaN thin film and the substrate have different lattice constants of crystals. Even when a buffer layer for reducing the difference in lattice constant is interposed between the GaN thin film and the substrate, the stress remains in the GaN thin film.

Furthermore, the GaN thin film and the substrate have different thermal expansion coefficients. For example, when a temperature of a substrate in which a GaN thin film has been hetero-epitaxially grown at a high temperature exceeding 1000° C. is lowered to the room temperature, the residual stress in the GaN thin film is further accumulated. The residual stress causes a split in the GaN thin film during processes of fabricating a transistor.

There are other factors responsible for a tendency to split in the GaN thin film. GaN thin film has a wurtzite crystalline structure, and is grown so that a (0001) plane appears on an upper surface of a substrate. Here, three cleavage planes of crystals each angled at 120 degrees are orthogonal to the upper surface of the substrate. Specifically, the GaN thin film tends to split in three directions each angled at 120 degrees.

When a part of the GaN thin film splits due to the difference in lattice constant or thermal expansion coefficient between the GaN thin film and the substrate as described above, the split is propagated in one of the three directions from the initial split part as a starting point.

There are other factors responsible for a tendency to split in the GaN thin film. The processes of fabricating a transistor include processes of laminating a protective film made of, for example, silicon nitride (SiN) on the upper surface of the GaN thin film and further partially removing the protective film.

If this protective film has stress, the stress is applied to the GaN thin film on part of which the protective film has been removed. Thus, the GaN thin film tends to split.

Typically, a semiconductor device such as a HEMT is fabricated with rows and columns of a plurality of element regions about several mm square being disposed on, for example, a 4-inch round substrate. Then, the semiconductor device is cut by, for example, a dicing blade for each of the element regions.

Here, portions to be cut by the dicing (regions along dicing lines and wider than the dicing lines) are referred to as dicing streets. The dicing streets are regions from which a protective film is removed in advance before the dicing. Formation of the dicing streets prevents the protective film from peeling off from a probable chipped portion in the dicing as a starting point.

The protective film made of, for example, SiN can be removed by reactive ion etching (i.e., RIE). However, the GaN thin film cannot be removed in the dicing streets because patterning the GaN thin film by the RIE is difficult. Thus, the GaN thin film in the dicing streets is susceptible to the stress of the protective film in non-street portions adjacent to the dicing streets (i.e., element regions). This sometimes causes a split in the GaN thin film. When the dicing streets are narrow, the GaN thin film further tends to split.

[Structure of Semiconductor Device]

A semiconductor device according to Embodiment 1 will be described with reference to drawings.

Figure 2:
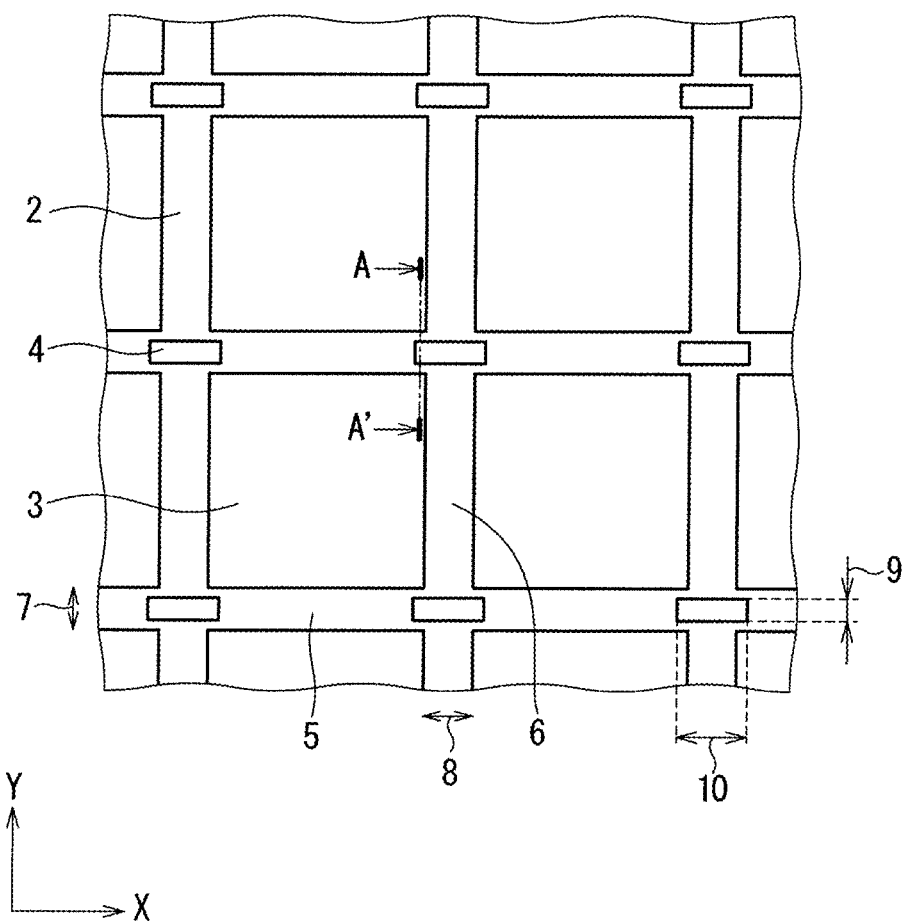
FIG. 2 illustrates an enlarged view of a part of the structure in FIG. 1.

FIG. 1 is a top view schematically illustrating an example structure of the semiconductor device according to Embodiment 1. FIG. 2 illustrates an enlarged view of a part of the structure in FIG. 1.

As exemplified in FIG. 1, a GaN thin film 2 is formed on an upper surface of a 4-inch SiC substrate in the semiconductor device 1. Rows and columns of a plurality of element regions 3 that are rectangular in a plan view are disposed along X- and Y-axes on the upper surface of the SiC substrate.

As exemplified in FIG. 2, X-axis direction dicing streets 5 extending along the X-axis are disposed between the element regions 3 adjacent in the vertical direction (Y-axis direction). Furthermore, Y-axis direction dicing streets 6 extending along the Y-axis are disposed between the element regions 3 adjacent in the horizontal direction (X-axis direction). Furthermore, stop islands 4 that are separation regions each including a SiN film are disposed at intersections between the X-axis direction dicing streets 5 and the Y-axis direction dicing streets 6.

Assuming that Y_ds denotes a y-axis projected dimension 7 of the X-axis direction dicing street 5, X_ds denotes an x-axis projected dimension 8 of the Y-axis direction dicing street 6, Y_si denotes a y-axis projected dimension 9 of the stop island 4, and X_si denotes an x-axis projected dimension 10 of the stop island 4, the following relationship holds:

$$X\_si > X\_ds \text{ and } Y\_si < Y\_ds. \qquad [\text{Math 1}]$$

As exemplified in FIG. 2, the stop islands 4 are separated from the element regions 3. The significance of these relationships will be described later.

Figure 3:
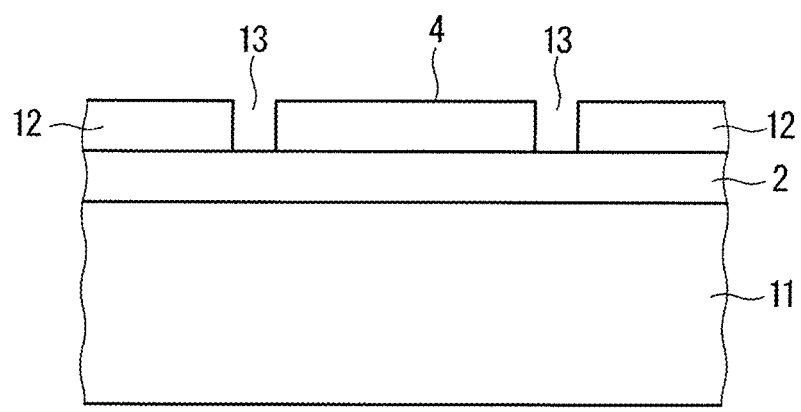
FIG. 3 schematically illustrates an example structure of a cross-section A-A' of FIG. 2.

FIG. 3 schematically illustrates an example structure of the cross-section A-A' of FIG. 2. As exemplified in FIG. 3, the GaN thin film 2 is laminated on an upper surface of a SiC substrate 11. Furthermore, a plurality of protective films 12 made of SiN are partially formed on an upper surface (corresponding to the element regions) of the GaN thin film 2.

The stop island 4 is disposed between the adjacent protective films 12. A dicing street 13 is formed between the stop island 4 and a corresponding one of the protective films 12.

A buffer layer may be formed between the SiC substrate 11 and the GaN thin film 2. Furthermore, electrodes may be disposed on the element regions except for the protective films 12. Each of the protective films 12 may be formed by laminating a plurality of types of materials.

The significance of the stop islands, and the magnitude relationship between the dicing streets and the stop islands in dimension will be described.

Figure 4:
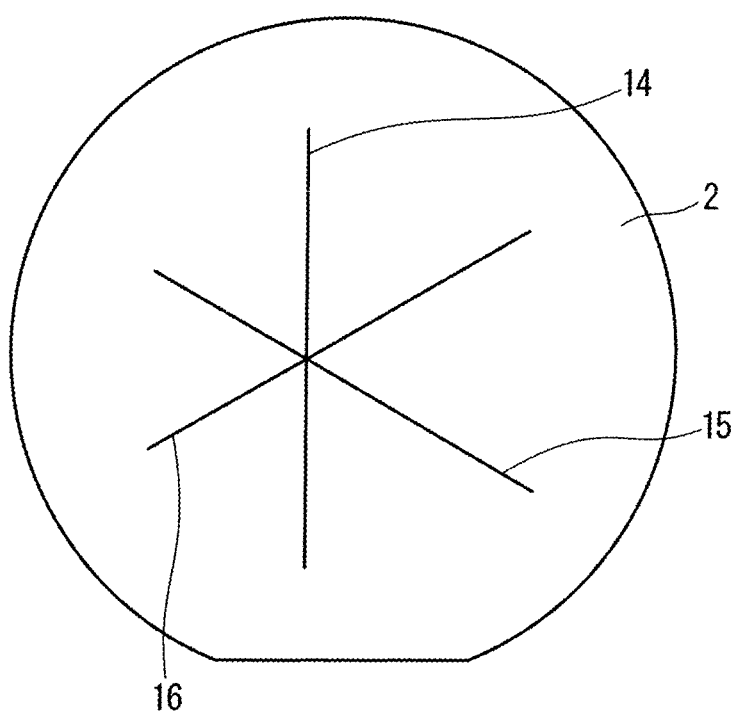
FIG. 4 illustrates cleavage planes of a GaN thin film according to the embodiment.

FIG. 4 illustrates cleavage planes of the GaN thin film 2 according to Embodiment 1. The GaN thin film 2 has a wurtzite crystalline structure, and is grown so that a (0001) plane appears as a growth plane. As exemplified in FIG. 4, a cleavage plane 14 (1-100), a cleavage plane 15 (01-10), and a cleavage plane 16 (−1010) each angled at 120 degrees tend to split.

Particularly, in the film growth on an upper surface of a heterogeneous substrate such as growth of a GaN thin film on an upper surface of a SiC substrate, when a substrate with the remaining stress caused by difference in lattice constant undergoes a thermal process in the processes of fabricating a transistor, the GaN thin film 2 sometimes splits. Then, the split is sometimes propagated to the end of the substrate along the cleavage planes, from the initial split part as a starting point. Examples of the thermal process in the processes of fabricating the transistor include a process of sintering electrodes and a process of forming the protective films 12. The split in the GaN thin film 2 sometimes causes the GaN thin film 2 in the vicinity of the split to peel off from the substrate. If the peeling of the GaN thin film 2 from the substrate is propagated to the element regions, the transistor sometimes malfunctions.

Furthermore, when the thermal expansion coefficient of the substrate is different from that of a thin film formed on the upper surface of the substrate in the growth of the GaN thin film on the upper surface of the SiC substrate and the substrate undergoes the thermal process in the processes of fabricating the transistor, the GaN thin film 2 at the end of the substrate sometimes splits. Then, the split is sometimes propagated from the center of the substrate to an end opposite to the substrate along the cleavage planes, from the initial split part as a starting point.

In contrast, depositing SiN on the upper surface of the GaN thin film 2 as the protective films 12 produces an advantage of preventing the propagation of the split in the GaN thin film 2. The SiN film as the protective film 12 is amorphous formed by, for example, sputtering or chemical vapor deposition (i.e., CVD), and does not have any clear cleavage plane. Thus, forming the SiN film on the upper surface of thin-film crystals with cleavage planes can prevent the propagation of a split caused by cleavage.

However, the SiN film in portions corresponding to dicing streets is removed in advance in a semiconductor device, as exemplified in FIG. 2. This removal prevents the SiN film from peeling off from a probable chipped portion as a starting point when the substrate is diced. If the peeling is propagated to the element regions, the transistor sometimes malfunctions.

Consequently, the propagation of the split in the GaN thin film 2 is prevented in the element regions on which the SiN film is formed. However, the propagation of the split in the GaN thin film 2 is not prevented in the portions corresponding to the dicing streets.

Figure 5:
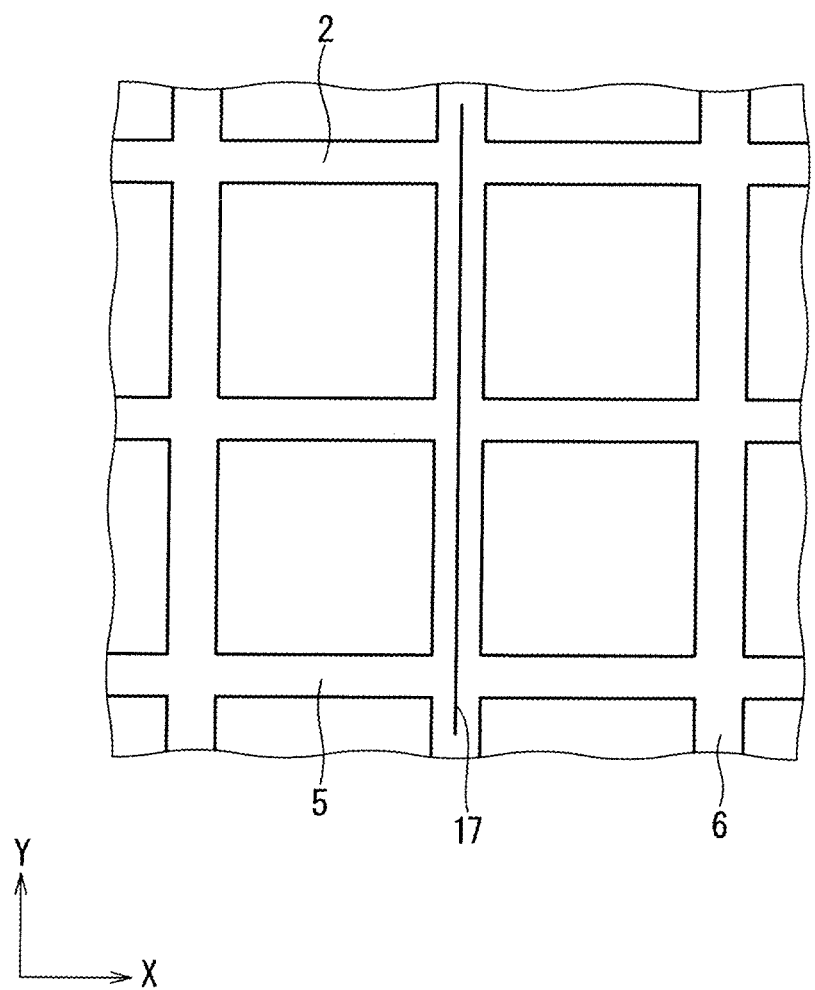
FIG. 5 illustrates an example state where a split in the GaN thin film is propagated in a dicing street.

FIG. 5 illustrates an example state where a split 17 is propagated in a dicing street in the GaN thin film 2. In the example of FIG. 5, when the extending direction of the Y-axis direction dicing street 6 coincides with (i.e., is parallel to) the direction of the cleavage plane (1-100) of the GaN thin film 2, the split 17 is propagated in the Y-axis direction dicing street 6 in the GaN thin film 2. In contrast, since the extending direction of the X-axis direction dicing street 5 does not coincide with the direction of the cleavage plane of the GaN thin film 2, it is unlikely that the split 17 is propagated in the GaN thin film 2.

Thus, the inventors have conceived a structure of foaming stop islands in dicing streets to prevent the propagation of the split 17 in the Y-axis direction dicing street 6 in the GaN thin film 2. Since each of the stop islands includes a SiN film, the propagation of the split 17 in the GaN thin film 2 can be prevented for the reasons described above.

Figure 6:
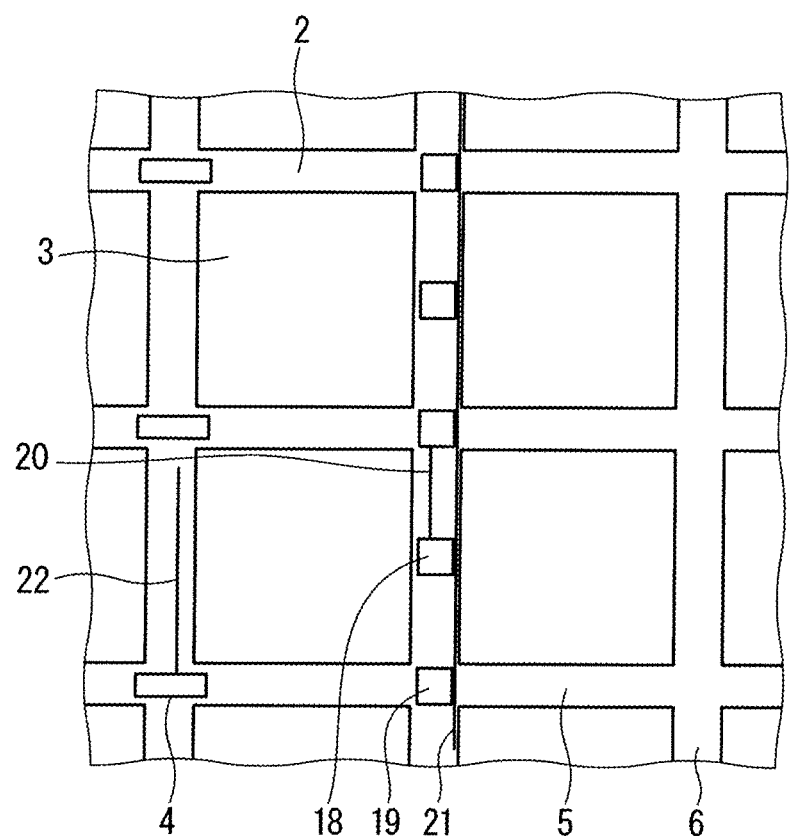
FIG. 6 exemplifies variations of shapes of stop islands, and representative propagation of splits.

FIG. 6 exemplifies variations of shapes of the stop islands, and representative propagation of splits. As exemplified in FIG. 6, the inventors have found that stop islands 18 disposed at portions other than intersections between the Y-axis direction dicing streets 6 and the X-axis direction dicing streets 5, and stop islands 19 disposed at the intersections between the Y-axis direction dicing streets 6 and the X-axis direction dicing streets 5 stop the propagation of a split 20 when the split 20 reaches these stop islands. This can prevent the transistor from malfunctioning due to the propagation of a split such as the split 20.

The inventors also have found the propagation of a split that avoids the stop islands 18 and 19 despite the arrangement of these stop islands, for example, a split 21. Through detailed observation of the split 21, the inventors have found that the split 21 is propagated through a narrow path between the stop islands 18 and 19, and the SiN film formed to correspond to the element region 3 adjacent to the lateral direction (a positive X direction in FIG. 6) of the stop islands 18 and 19. If the SiN film formed to correspond to the element region 3 has tensile stress and a void with a narrow width in the Y-axis direction exists between the stop islands and the element region 3, the GaN thin film 2 at the void is considered as a starting point of a split to be propagated in the Y-axis direction.

In contrast, the stop island 4 disposed on the upper surface of the GaN thin film 2 at the intersections between the Y-axis direction dicing streets 6 and the X-axis direction dicing streets 5 not only stops the propagation of a split 22 when the split 22 reaches the stop island 4, but also prevents the split 22 from surrounding the stop island 4 and further being propagated to the Y-axis direction.

The x-axis projected dimension X_si of the stop island 4 is larger than the x-axis projected dimension X_ds of the Y-axis direction dicing street 6. This eliminates a path allowing the split 22 from being linearly propagated to the Y-axis direction, and can reliably stop the propagation of the split 22 in one element.

Here, it is necessary to prevent any narrow void extending in the Y-axis direction from being created between the stop island 4 and the element region 3. In other words, the y-axis projected dimension Y_si of the stop island 4 needs to be smaller than the y-axis projected dimension Y_ds of the X-axis direction dicing street 5.

[Method for Manufacturing Semiconductor Device]

Figure 7:
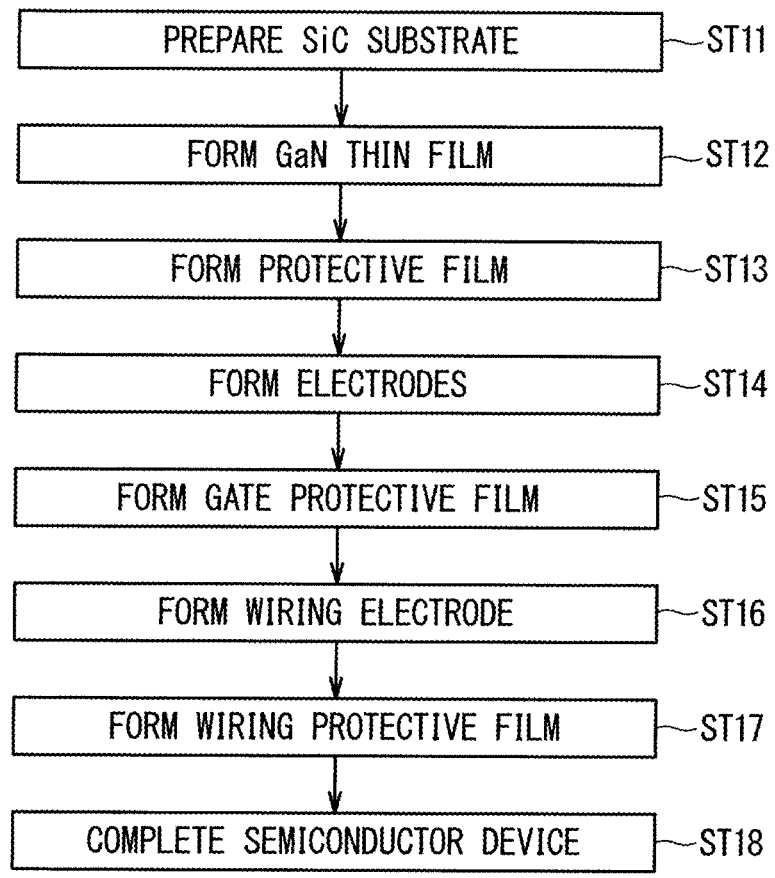
FIG. 7 is a flowchart illustrating example processes for fabricating the semiconductor device according to the embodiment.

Next, a method for manufacturing the semiconductor device according to Embodiment 1 will be described with reference to FIGS. 3 and 7. FIG. 7 is a flowchart illustrating example processes for fabricating the semiconductor device according to Embodiment 1.

First, the SiC substrate 11 is prepared as illustrated in FIG. 3 (Step ST11 in FIG. 7). The SiC substrate 11 has a semi-insulating 4H structure, and has a dimension of 4 inches.

Next, the GaN thin film 2 is formed on the SiC substrate 11 (Step ST12 in FIG. 7). One or more buffer layers different in composition from SiC are formed on the upper surface of the SiC substrate 11. Then, the GaN thin film 2 (a GaN layer) and further an AlGaN layer are sequentially epitaxially grown in this order.

A composition ratio or a film thickness of each of the buffer layers is adjusted so that the lattice mismatch with the Si substrate 11 and the GaN thin film 2 is relaxed and further the stress in the GaN thin film 2 is relaxed.

The sequential epitaxial growth of the AlGaN layer on the upper surface of the GaN thin film 2 creates an electron layer of a high concentration referred to as two-dimensional electron gas, in the vicinity of an interface between the GaN thin film 2 and the AlGaN layer in the GaN thin film 2 due to spontaneous polarization effects and piezoelectric polarization effects of AlGaN. Unlike an electron layer formed by doping impurities, ions in electrons hardly scatter in this electron layer, and this electron layer exhibits very high electron mobility.

A cap layer different in composition from the AlGaN layer may be further epitaxially grown on the upper surface of the AlGaN layer, or a layer doped with impurities of, for example, Fe or carbon (C) may be interposed in a part of the GaN thin film 2. As such, the GaN thin film 2 is formed on the upper surface of the SiC substrate 11.

Next, the protective film 12 is formed (Step ST13 in FIG. 7). Specifically, a SiN film is formed on the upper surface of the top AlGaN layer or the cap layer as the protective film 12. Example methods for forming the protective film 12 can include the plasma CVD, the CAT-CVD, and sputtering.

Next, electrodes are formed (Step ST14 in FIG. 7). Specifically, regions of the protective film 12 which is formed in Step ST13 in FIG. 7 and in which a gate electrode, a source electrode, and a drain electrode are to be formed are opened by, for example, the RIE. Further, these electrodes are formed by combination of sputtering and a lift-off method, etc.

Since the source electrode and the drain electrode are in Ohmic contact with the GaN thin film 2, a thermal process is sometimes performed after the formation. Before forming the electrodes, the GaN thin film 2 is sometimes doped with impurities by implanting ions in the regions in which the electrodes are to be formed as necessary. In contrast, the gate electrode requires being thinned and adjustment of a cross-sectional shape for adjusting the field distribution to be applied to the GaN thin film 2. Thus, the gate electrode is formed by combination of a plurality of resist processes simultaneously with the opening of the protective film 12.

When the protective film 12 corresponding to the regions in which the electrodes are to be formed is opened in Step ST14 in FIG. 7, the dicing streets are simultaneously opened to expose the AlGaN layer or the cap layer. Furthermore, the protective film 12 at positions corresponding to the stop islands 4 remains at the intersections between the X-axis direction dicing streets 5 and the Y-axis direction dicing streets 6. The shape of the stop islands 4 is the same as illustrated in, for example, FIG. 2.

Here, when the protective film 12 has tensile stress, the protective film 12 remaining when the dicing streets are opened pulls the GaN thin film 2 in the dicing streets. Thus, the GaN thin film 2 sometimes splits. In such a case, however, the stop islands 4 sufficiently prevent the propagation of the split.

Next, a gate protective film is formed (Step ST15 in FIG. 7). The gate electrode has a fine linewidth, and has a special cross-sectional shape. Thus, a SiN film is formed as a gate protective film for protecting the gate electrode. Example methods for forming the gate protective film can include the plasma CVD, the CAT-CVD, and sputtering.

Next, a wiring electrode is formed (Step ST16 in FIG. 7). In the gate protective film formed in Step ST15 in FIG. 7, a connected part of the gate electrode, a connected part of the source electrode, and a connected part of the drain electrode are opened by, for example, the RIE. Further, the wiring electrode is formed by combination of sputtering and the lift-off method, etc.

When the gate protective film corresponding to the connected parts of the electrodes is opened in Step ST16 in FIG. 7, the dicing streets at the corresponding positions are simultaneously opened. Furthermore, the gate protective film at the positions corresponding to the stop islands 4 remains at the intersections between the X-axis direction dicing streets 5 and the Y-axis direction dicing streets 6. The shape of the stop islands 4 is the same as illustrated in, for example, FIG. 2.

Here, when the gate protective film has tensile stress, the protective film 12 remaining when the dicing streets are opened pulls the GaN thin film 2 in the dicing streets. Thus, the GaN thin film 2 sometimes splits. In such a case, however, the stop islands 4 sufficiently prevent the propagation of the split.

Next, a wiring protective film is formed (Step ST17 in FIG. 7). Specifically, a SiN film is formed to protect the whole elements. Example methods for forming the SiN film can include the plasma CVD, the CAT-CVD, and sputtering.

When a region corresponding to an electrode pad is opened by, for example, the RIE in the wiring protective film formed in Step ST17 in FIG. 7, the dicing streets are opened simultaneously. Furthermore, the wiring protective film at the positions corresponding to the stop islands 4 remains at the intersections between the X-axis direction dicing streets 5 and the Y-axis direction dicing streets 6. The shape of the stop islands 4 is the same as illustrated in, for example, FIG. 2.

Here, when the wiring protective film has tensile stress, the protective film 12 remaining when the dicing streets are opened pulls the GaN thin film 2 in the dicing streets. Thus, the GaN thin film 2 sometimes splits. In such a case, however, the stop islands 4 sufficiently prevent the propagation of the split.

In the procedure exemplified in FIG. 7, the protective film 12, the gate protective film, and the wiring protective film are formed. These three films are laminated on the stop islands 4. However, two or one of the three films may be formed on the upper surface of the stop islands 4, or an additional layer structure except these three films may be added.

In forming the wiring electrode in Step ST16 in FIG. 7, the wiring electrode may be thickened by plating in addition to sputtering for reducing the wiring resistance. When the electrode need to cross for convenience of routing the electrode, a point-to-point construction process using a sacrificial layer or a three-dimensional wiring process of interposing an interlayer insulating film may be performed.

As such, execution of Steps ST11 to ST17 in FIG. 7 completes the semiconductor device according to Embodiment 1 (Step ST18 in FIG. 7).

[Method for Manufacturing GaN-HEMT Chips]

Figure 8:
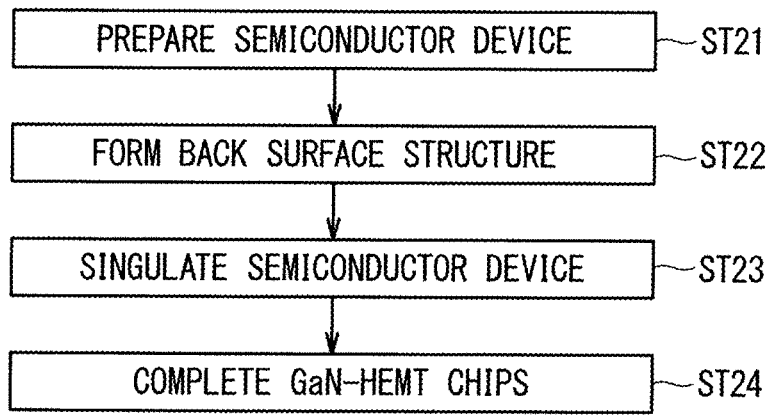
FIG. 8 is a flowchart illustrating example processes for fabricating GaN-HEMT chips according to the embodiment.

Next, a manufacturing method for fabricating GaN-HEMT chips from the semiconductor device according to Embodiment 1 will be described with reference to FIG. 8. FIG. 8 is a flowchart illustrating example processes for fabricating the GaN-HEMT chips according to Embodiment 1.

First, the semiconductor device manufactured by the processes in Steps ST11 to ST18 in FIG. 7 is prepared (Step ST21 in FIG. 8).

Next, a back surface structure is formed (Step ST22 in FIG. 8). Although the detailed description is omitted, this process includes a process of temporarily bonding, with wax, a device surface of the semiconductor device to a supporting substrate separately prepared, a process of thinning the SiC substrate 11 on the back surface that is opposite to the device surface of the semiconductor device and forming via holes (i.e., substrate thorough holes), a process of forming electrodes on the back surface, and a process of removing the supporting substrate from the device surface of the semiconductor device by melting the wax.

Next, the semiconductor device is singulated through dicing (Step ST23 in FIG. 8). A protection tape (e.g., a dicing tape) is attached to the back surface (i.e., a lower surface of the SIC substrate 11) in the semiconductor device in which the back surface structure has been formed through Step ST22 in FIG. 8. Then, the semiconductor device is cut into cubes for each of the element regions 3 with a rotary knife (e.g., a dicing blade) or a laser.

In the portions to be cut in Step ST23 in FIG. 8, the protective film at the corresponding positions is removed for opening the dicing streets as illustrated in Steps ST14, ST16, and ST17 in FIG. 7. The protective film subjected to the substrate chipping in the cutting is sufficiently controlled.

Since the protective film remains as the stop island 4 in a part of the dicing streets, the film sometimes peels off when the semiconductor device is cut for each of the element regions 4. However, the stop islands 4 are separated from the protective film 12 in the element regions 3. Thus, extension of the peeling to the element regions 3 is sufficiently prevented. Consequently, the influence to the yield of the elements is sufficiently small.

As such, execution of Steps ST21 to ST23 in FIG. 8 completes the GaN-HEMT chips from the semiconductor device according to Embodiment 1 (Step ST24 in FIG. 8).

Embodiment 2

A semiconductor device according to Embodiment 2, and a method for manufacturing the semiconductor device will be described. In the following description, the same reference numerals are assigned to the same constituent elements as those in Embodiment 1, and the detailed description will be appropriately omitted.

As described in Embodiment 1, high electron mobility transistors (HEMTs), which have been put to practical use as transistors that can perform high-output and high-frequency operations, can achieve high withstand voltages through the use of the active layers made of gallium nitride (GaN), and can further achieve low resistance through the use of the HEMT structure.

However, producing high output through application of a high voltage increases an amount of heat generated in elements. This leads to degradation in the electrical characteristics of the elements and further a decrease in the reliability of the elements. Thus, the elements have no choice but to be driven under conditions for producing lower output than the allowable capacity of the elements. Thus, inhibiting the elevation of temperature caused by the heat generated in the elements is desired for driving the elements with high output.

In the HEMT structure, the amount of heat generated in each portion of a semiconductor device greatly differs. Particularly, a micro region in the vicinity of a gate electrode to which the highest electric field is applied, on the upper surface of the GaN thin film 2 has the highest heat density.

Although a GaN-HEMT chip has a structure in which a back surface is bonded to a heat sink and heat can be dissipated from the entire back surface, the heat generated in the micro region cannot be diffused to the entire back surface due to the constraints in the thermal conductivity of a substrate included in the GaN-HEMT chip.

Thus, a diamond substrate higher in thermal conductivity than current SiC substrates is used as the substrate included in the GaN-HEMT chip according to Embodiment 2. When the diamond substrate is used as the substrate of the GaN-HEMT chip, the structure of the semiconductor device is similar to that according to Embodiment 1. However, a procedure for fabricating the semiconductor device is different from that according to Embodiment 1. Here, the GaN thin film 2 tends to split in processes different from those in Embodiment 1. Thus, the structure of forming the stop islands in the dicing streets is effective at preventing the split.

[Structure of Semiconductor Device]

The semiconductor device according to Embodiment 2 will be described with reference to drawings.

Figure 9:
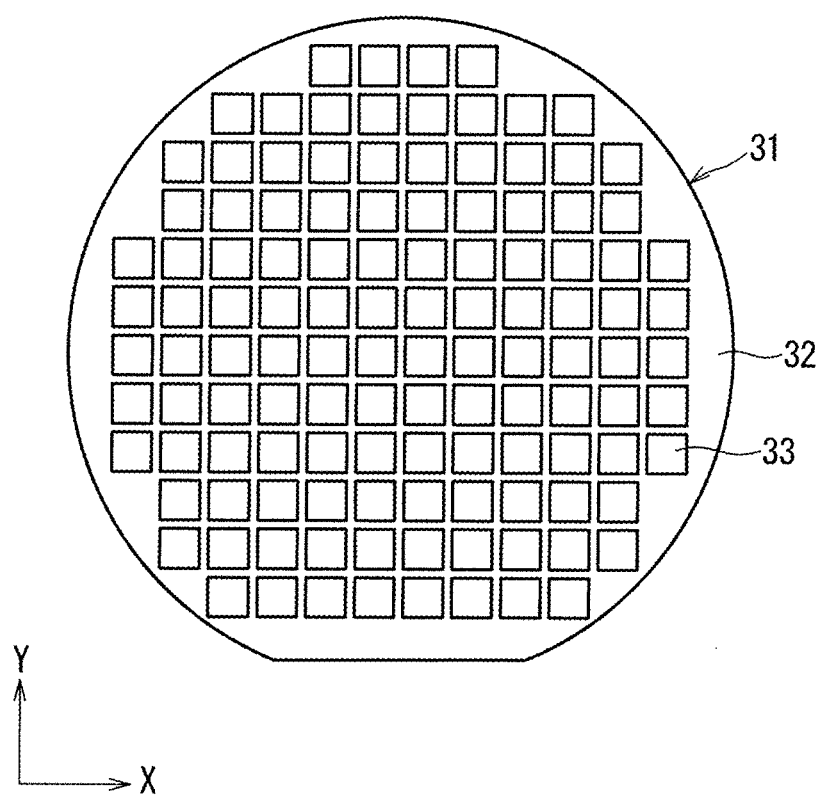
FIG. 9 is a top view schematically illustrating an example structure of a semiconductor device according to an embodiment.
Figure 10:
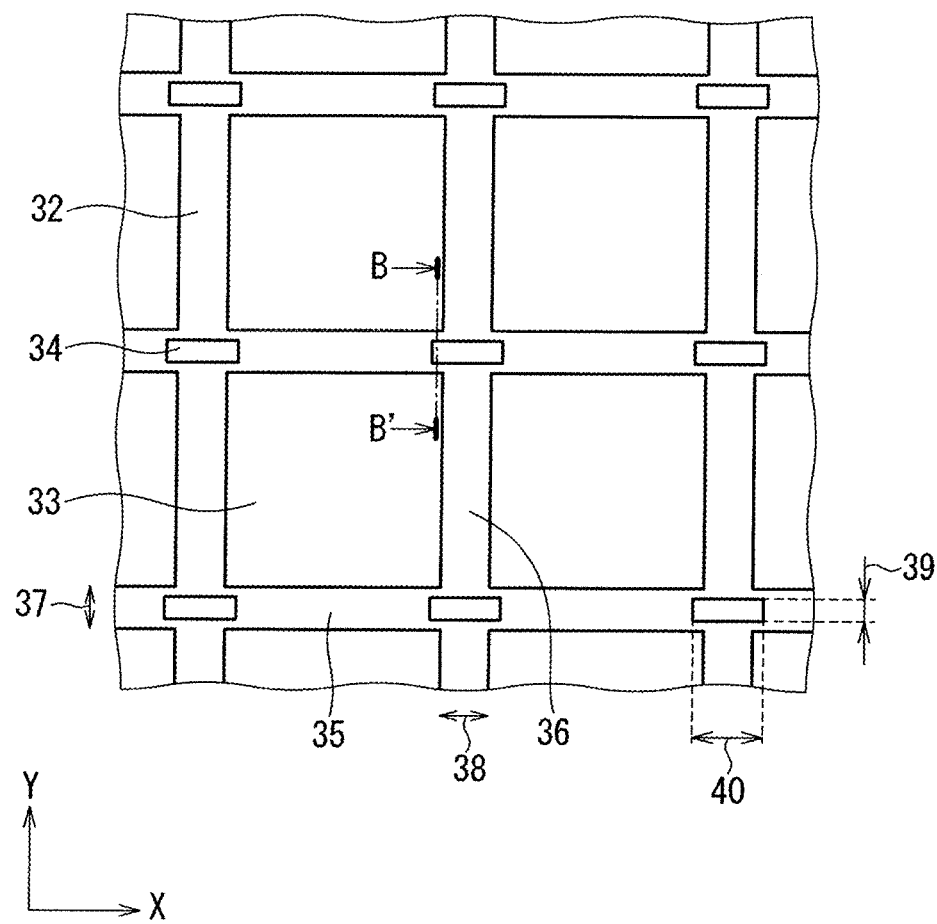
FIG. 10 illustrates an enlarged view of a part of the structure in FIG. 9.

FIG. 9 is a top view schematically illustrating an example structure of the semiconductor device according to Embodiment 2. FIG. 10 illustrates an enlarged view of a part of the structure in FIG. 9.

As exemplified in FIG. 9, a GaN thin film 32 is formed on an upper surface of a 4-inch diamond substrate in a semiconductor device 31. Rows and columns of a plurality of element regions 33 that are rectangular in a plan view are disposed along X- and Y-axes on the upper surface of the diamond substrate.

As exemplified in FIG. 10, X-axis direction dicing streets 35 are disposed between the element regions 3 adjacent in the vertical direction (Y-axis direction), and Y-axis direction dicing streets 36 are disposed between the element regions 3 adjacent in the horizontal direction (X-axis direction). Furthermore, stop islands 34 that are separation regions each including a SiN film are disposed at intersections between the X-axis direction dicing streets 35 and the Y-axis direction dicing streets 36.

Assuming that Y_ds denotes a y-axis projected dimension 37 of the X-axis direction dicing street 35, X_ds denotes an x-axis projected dimension 38 of the Y-axis direction dicing street 36, Y_si denotes a y-axis projected dimension 39 of the stop island 34, and X_si denotes an x-axis projected dimension 40 of the stop island 34, the following relationship holds:

$$X\_si > X\_ds \text{ and } Y\_si < Y\_ds. \qquad [\text{Math 2}]$$

As exemplified in FIG. 10, the stop islands 34 are separated from the element regions 33. The significance of these relationships is the same as described in Embodiment 1.

Figure 11:
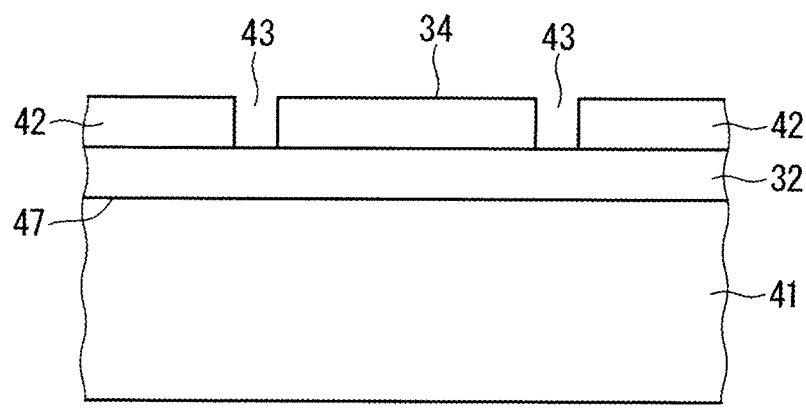
FIG. 11 schematically illustrates an example structure of a cross-section B-B' of FIG. 10.

FIG. 11 schematically illustrates an example structure of the cross-section B-B' of FIG. 10. As exemplified in FIG. 11, the GaN thin film 32 is laminated on an upper surface of a diamond substrate 41. Furthermore, a plurality of protective films 42 made of SiN are formed on a part of an upper surface (corresponding to the element regions) of the GaN thin film 32.

The stop islands 34 are disposed between the adjacent protective films 42. A dicing street 43 is formed between the stop island 34 and a corresponding one of the protective films 42.

A buffer layer or a bonding layer may be formed between the diamond substrate 41 and the GaN thin film 32. Electrodes may be disposed on the element regions except for the protective films 42. The protective films 42 may be formed by laminating a plurality of types of materials.

A split tends to be propagated in the GaN thin film 32 according to Embodiment 2, in an aspect different from that according to Embodiment 1. However, the semiconductor device according to Embodiment 2 can sufficiently prevent the propagation of the split in the GaN thin film 32 in this aspect.

[Method for Manufacturing Semiconductor Device]

Figure 12:
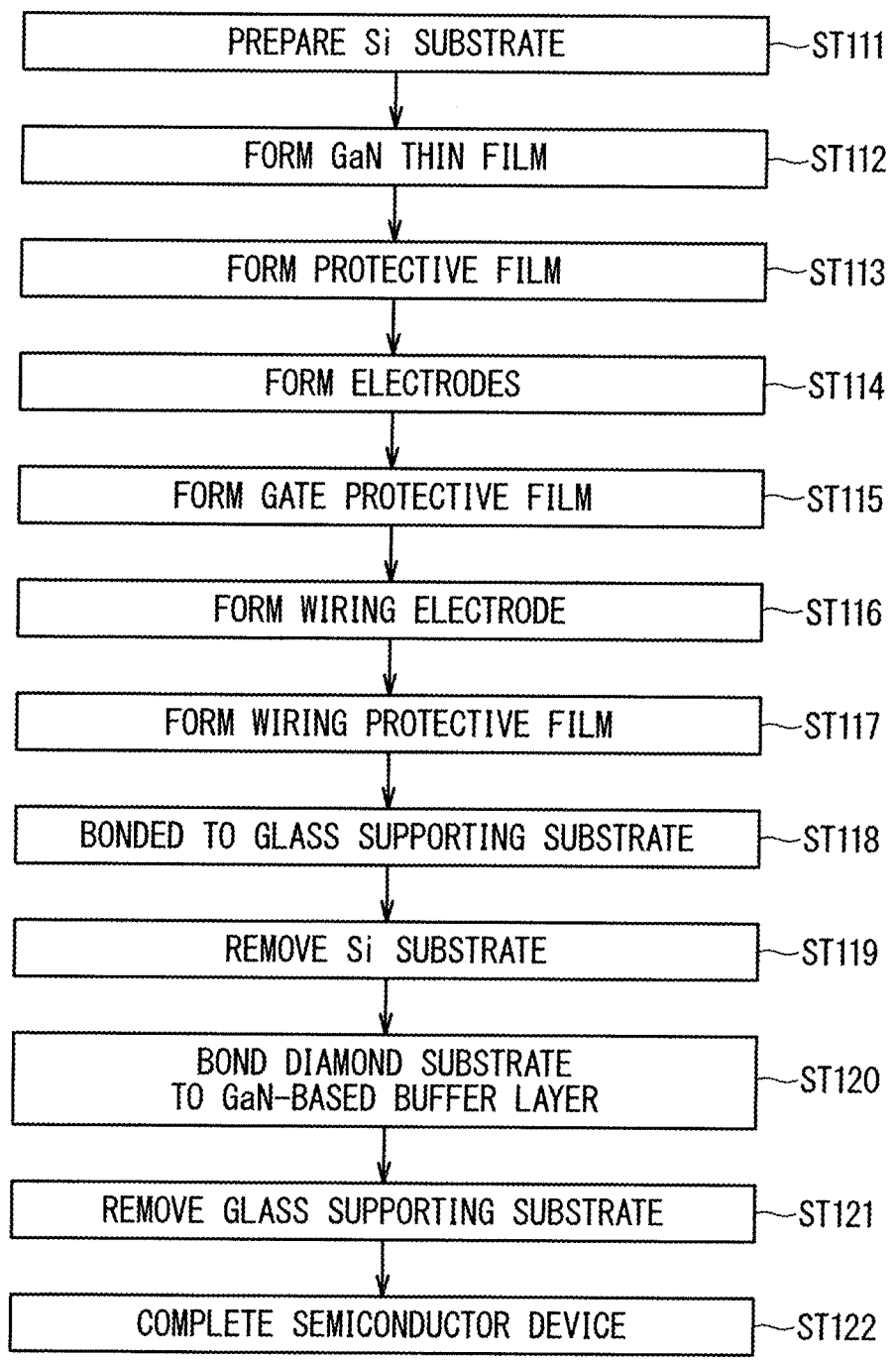
FIG. 12 is a flowchart illustrating example processes for fabricating the semiconductor device according to the embodiment.

Next, a method for manufacturing the semiconductor device according to Embodiment 2 will be described with reference to FIGS. 11 to 16. FIG. 12 is a flowchart illustrating example processes for fabricating the semiconductor device according to Embodiment 2.

First, a Si substrate is prepared (Step ST111 in FIG. 12). The Si substrate is a substrate in a (111) plane direction, and has a dimension of 4 inches.

The reason why the Si substrate is used in Embodiment 2 unlike Embodiment 1 is because the Si substrate is removed in the latter processes. The application of not a SiC substrate but the Si substrate produces advantages of not only increasing the removal performance (i.e., facilitating the removal) but also reducing material cost of products.

Next, the GaN thin film 32 is formed on the upper surface of the Si substrate (Step ST112 in FIG. 12). One or more buffer layers different in composition from Si are formed on the upper surface of the Si substrate. Then, the GaN thin film 32 (a GaN layer) and further an AlGaN layer are sequentially epitaxially grown in this order.

A composition ratio or a film thickness of each of the buffer layers is adjusted so that the lattice mismatch with the Si substrate and the GaN thin film 32 is relaxed and further the stress in the GaN thin film 32 is relaxed.

The stress remaining in the GaN thin film 32 epitaxially grown on the upper surface of the Si substrate is greater than that remaining in the GaN thin film 2 epitaxially grown on the upper surface of the SiC substrate 11. Thus, it is desired to adjust the buffer layers with high precision.

Next, the protective film 42 is formed in the same manner as Step ST13 in FIG. 7 (Step ST113 in FIG. 12). Next, electrodes are formed in the same manner as Step ST14 in FIG. 7 (Step ST114 in FIG. 12). Next, a gate protective film is formed in the same manner as Step ST15 in FIG. 7 (Step ST115 in FIG. 12). Next, a wiring electrode is formed in the same manner as Step ST16 in FIG. 7 (Step ST116 in FIG. 12). Next, a wiring protective film is formed in the same manner as Step ST17 in FIG. 7 (Step ST117 in FIG. 12).

Figure 13:
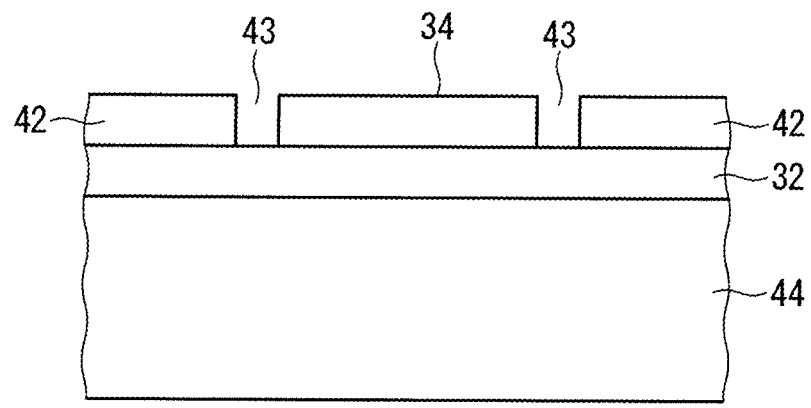
FIG. 13 is a cross-sectional view schematically illustrating an example structure of a Si substrate in which a wiring protective film has been formed in Step ST117 in FIG. 12.

Next, the resulting structure is bonded to a supporting substrate (Step ST118 in FIG. 12). FIG. 13 is a cross-sectional view schematically illustrating an example structure of a Si substrate 44 in which the wiring protective film has been formed in Step ST117 in FIG. 12.

Figure 14:
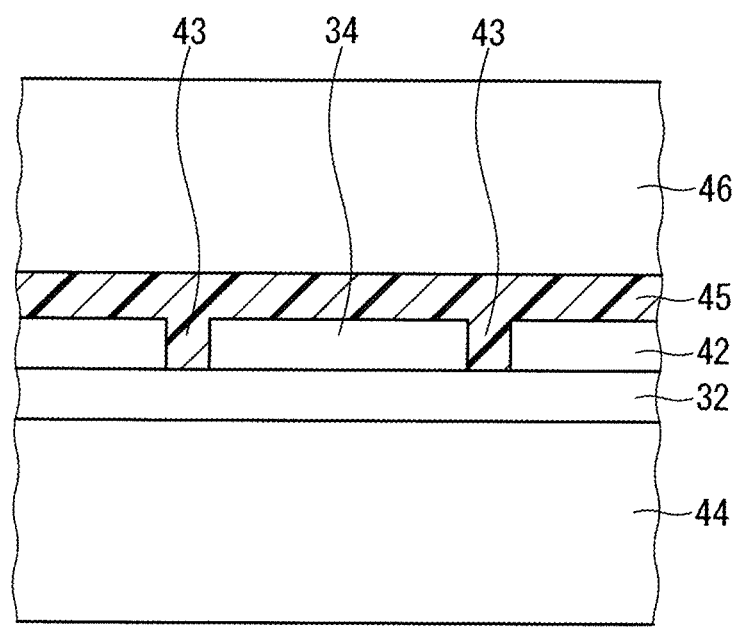
FIG. 14 is a cross-sectional view schematically illustrating an example structure in which a glass supporting substrate is bonded to an upper surface of the Si substrate through, for example, a resin layer.

Furthermore, FIG. 14 is a cross-sectional view schematically illustrating an example structure in which a glass supporting substrate 46 is bonded to an upper surface of the Si substrate 44 through, for example, a resin layer 45.

As exemplified in FIG. 14, the resin layer 45 made of a photocurable resin is applied to the upper surface of the Si substrate 44 to cover the protective film 42, the X-axis direction dicing streets 35, the Y-axis direction dicing streets 36, and the stop islands 34. Then, the resin layer 45 is irradiated with, for example, ultraviolet light with the glass supporting substrate 46 tightly adhering to an upper surface of the resin layer 45 in a vacuum to cure the resin layer 45.

Next, the Si substrate 44 is removed (Step ST119 in FIG. 12). Specifically, the Si substrate 44 is removed from its lower surface by mechanical grinding until the remaining thickness of the Si substrate 44 is 20 μm. Furthermore, the Si substrate 44 is removed by the RIE until the remaining thickness of the Si substrate 44 becomes zero.

The remaining thickness of the mechanical ground Si substrate 44 should be determined, based on the parallelism of the Si substrate 44 and the glass supporting substrate 46 and the parallelism of mechanical grinding. Furthermore, the RIE using a mixed gas of $SF_6$ and $O_2$ as etching gas can take a higher etch rate ratio (selection ratio) with a GaN-based buffer layer appearing on the lower surface of the GaN thin film 32 after removing Si.

Figure 15:
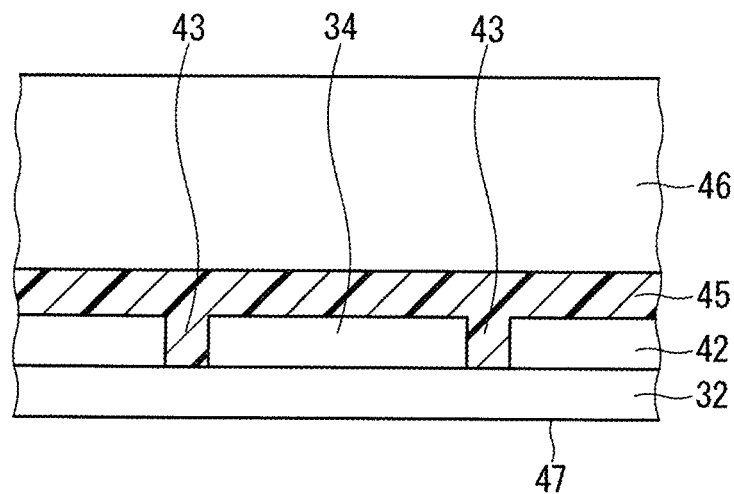
FIG. 15 is a cross-sectional view schematically illustrating an example structure in which a GaN-based buffer layer is exposed on a lower surface of a GaN thin film.

FIG. 15 is a cross-sectional view schematically illustrating an example structure in which removal of the Si substrate 44 as described above exposes a GaN-based buffer layer 47 on the lower surface of the GaN thin film 32.

The process of removing the Si substrate 44 is a process of removing the Si substrate 44 to which the GaN thin film 32 had adhered with a higher degree of adhesion. Thus, removal of the Si substrate 44 releases the stress in the GaN thin film 32.

When the GaN thin film 32 has tensile stress, the GaN thin film 32 tends to split. Particularly, the protective films 42 that prevent a split in the GaN thin film 32 are formed on the upper surface of the GaN thin film 32 at positions corresponding to the element regions, whereas the resin layer 45 is directly formed on the upper surface of the GaN thin film 32 at positions corresponding to the dicing streets. Thus, the GaN thin film 32, particularly, at the positions corresponding to the dicing streets tends to split.

In contrast, the semiconductor device according to Embodiment 2 includes the stop islands 34 as exemplified in, for example, FIG. 10. Thus, even when the GaN thin film 32 splits, the stop islands 34 prevent the propagation of the split.

Next, the diamond substrate 41 is bonded to the GaN-based buffer layer 47 exposed on the lower surface of the GaN thin film 32 (Step ST120 in FIG. 12). A surface activated bonding method is used in this process, as the GaN thin film 32 is bonded to the diamond substrate 41 in a technique with a small interfacial thermal resistance. The surface activated bonding method is a technique in which a surface to be bonded is smoothed, then cleaned by argon beams in a vacuum, and pressed and bonded as it is.

The smoothness of the surface to be bonded is preferably lower than or equal to Ra 0.5 nm. Chemical mechanical polishing (CMP) is applicable as the smoothing process.

The CMP processing is performed on the GaN-based buffer layer 47 exposed on the lower surface of the GaN thin film 32 which is exemplified in FIG. 15. Here, a GaN-based material has high hardness, and requires a high polishing pressure and a long polishing time in the CMP processing. Consequently, the horizontal tensile stress is applied to the GaN thin film 32. This sometimes causes a split in the GaN thin film 32.

To address this, the semiconductor device according to Embodiment 2 includes the stop islands 34 as exemplified in, for example, FIG. 10. Even when the GaN thin film 32 splits, the stop islands 34 prevent the propagation of the split.

Figure 16:
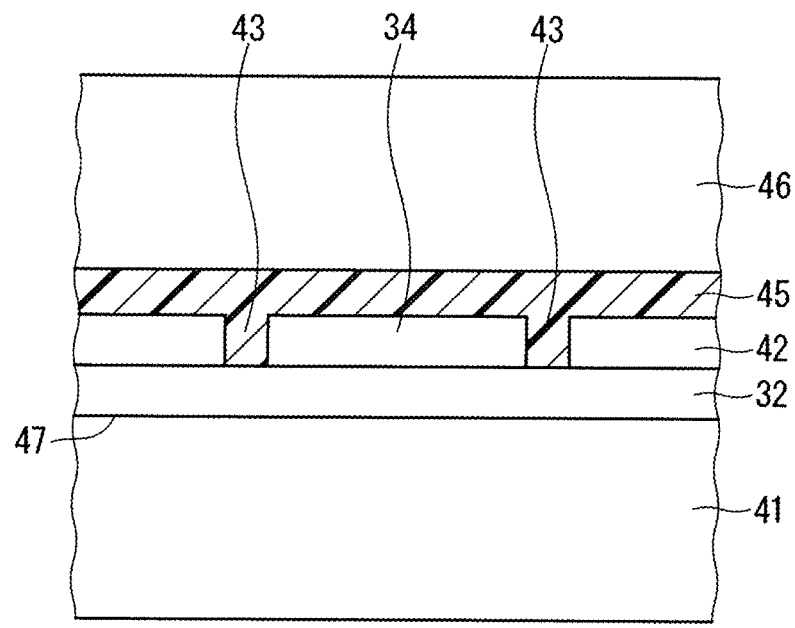
FIG. 16 is a cross-sectional view schematically illustrating an example structure in which a diamond substrate is bonded to the GaN-based buffer layer.

Bonding a polycrystalline diamond substrate on which the smoothing process has been performed in advance to the GaN-based buffer layer 47 on which the smoothing process has been performed produces the structure as exemplified in FIG. 16. Here, FIG. 16 is a cross-sectional view schematically illustrating an example structure in which the diamond substrate 41 is bonded to the GaN-based buffer layer 47 as described above.

Although the GaN-based buffer layer 47 is smoothed in Embodiment 2, the GaN-based buffer layer 47 may be removed by increasing the polishing depth in the CMP processing to expose the GaN thin film 32 and then the GaN thin film 32 may be smoothed to reduce the thermal resistance between the GaN thin film 32 and the diamond substrate 41.

Since bonding together heterogeneous combinations such as a combination of the GaN thin film 32 to the diamond substrate 41 sometimes lacks the adhesion strength, for example, a bonding layer made of a-Si can be interposed at the bonding interface.

Although the polycrystalline diamond substrate is used in Embodiment 2, a monocrystalline diamond substrate may be used instead. The monocrystalline diamond substrate is advantageous for performing the smoothing process. However, no large-diameter monocrystalline diamond substrate (e.g., substrates larger than or equal to 2 inches) exists.

Next, the glass supporting substrate 46 is removed (Step ST121 in FIG. 12). Evaporating the resin at the interface between the glass supporting substrate 46 and the resin layer 45 by sweep irradiation of laser light from the glass supporting substrate 46 side removes the glass supporting substrate 46 from the upper surface of the diamond substrate 41. Specifically, a thin color-tinted resin layer (not illustrated) is interposed between the glass supporting substrate 46 and the resin layer 45. This color-tinted resin layer absorbs most of the laser light. Thus, the color-tinted resin layer evaporates. When the color-tinted resin layer evaporates, a vapor phase between the glass supporting substrate 46 and the resin layer 45 almost eliminates the adhesion strength between them. Thus, the glass supporting substrate 46 easily becomes detached from the upper surface of the diamond substrate 41. Then, the resin layer 45 can be easily removed from the end of the upper surface of the diamond substrate 41 by a tape stripping technique.

As such, execution of Steps ST111 to ST121 in FIG. 12 completes the semiconductor device according to Embodiment 2 (Step ST122 in FIG. 12).

Since the manufacturing method for fabricating GaN-HEMT chips from the semiconductor device according to Embodiment 2 is the same as described in Embodiment 1, the description is omitted.

[Advantages of Embodiments Described Above]

Next, example advantages of Embodiments described above will be described. Although the advantages are described based on the specific structures whose examples are described in Embodiments, the structures may be replaced with other specific structures whose examples are described in this DESCRIPTION as long as the same advantages are produced.

Such replacement may be performed across a plurality of embodiments. Specifically, the replacement may be performed when combinations of the structures whose examples are described in different embodiments produce the same advantages.

According to Embodiments described above, a semiconductor device includes a semiconductor film, a plurality of the protective films 12 (or the protective films 42), a first dicing street, a second dicing street, and the stop island 4 (or stop island 34). Here, the semiconductor film is, for example, the GaN thin film 2 or the GaN thin film 32. The first dicing street is, for example, the X-axis direction dicing street 5 or the X-axis direction dicing street 35. The second dicing street is, for example, the Y-axis direction dicing street 6 or the Y-axis direction dicing street 36. The GaN thin film 2 (or the GaN thin film 32) is formed on an upper surface of a substrate. Here, the substrate is, for example, one of the SiC substrate 11, the diamond substrate 41, and the Si substrate 44 (the substrate may be one of them for convenience in the following description). The plurality of protective films 12 (or protective films 42) are partially formed on an upper surface of the GaN thin film 2 (or the GaN thin film 32). The X-axis direction dicing street 5 (or the X-axis direction dicing street 35) passes between the element regions 3 (or the element regions 33) on which the plurality of protective films 12 (or protective films 42) are formed one-to-one. The X-axis direction dicing street 5 (or the X-axis direction dicing street 35) extends along a first axis (X-axis) in a plan view. The Y-axis direction dicing street 6 (or the Y-axis direction dicing street 36) passes between the element regions 3 (or the element regions 33). The Y-axis direction dicing street 6 (or the Y-axis direction dicing street 36) extends along a second axis (Y-axis) in the plan view. The stop island 4 (or stop island 34) is disposed on the upper surface of the GaN thin film 2 (or the GaN thin film 32) at an intersection between the X-axis direction dicing street 5 (or the X-axis direction dicing street 35) and the Y-axis dicing street 6 (or the Y-axis direction dicing street 36). The stop island 4 (or stop island 34) is in non-contact with the element region 3 (or the element regions 33). Here, assuming that X_si denotes a projected dimension of the stop island 4 (or stop island 34) to the first axis, Y_si denotes a projected dimension of the stop island 4 (or stop island 34) to the second axis, X_ds denotes a projected width of the Y-axis direction dicing street 6 (or the Y-axis direction dicing street 36) to the first axis, and Y_ds denotes a projected width of the X-axis direction dicing street 5 (or the X-axis direction dicing street 35) to the second axis, X_si >X_ds and Y_si<Y_ds are satisfied. The first dicing street should simply cross the second dicing street, irrespective of whether the first dicing street is orthogonal to the second dicing street. Thus, X_si that is a projected dimension of the stop island 4 to the first axis and Y_si that is a projected dimension of the stop island 4 to the second axis are not limited to dimensions of the stop island 4 in an orthogonal direction. Similarly, X_ds that is a projected width of a dicing street to the first axis, and Y_ds that is a projected width of another dicing street to the second axis are not limited to dimensions of the dicing streets in an orthogonal direction.

In this structure, each of the stop islands 4 is disposed at the intersection between the X-axis direction dicing street 5 and the Y-axis direction dicing street 6. Thus, even when the GaN thin film 2 in the dicing streets splits, the propagation of the split is prevented at the position of the stop island 4. The relationship of X_si>X_ds and Y_si<Y_ds is satisfied while the stop islands 4 are separated from the element regions 3. Even when the semiconductor device is diced across the stop islands 4, peeling of the protective films 12 can be prevented from reaching the element regions 3. Particularly, the propagation of the split in the dicing street extending in the Y-axis direction can be effectively prevented. Specifically, a path passing through the intersection and extending in the Y-axis direction is blocked by the stop island 4 whose x-axis projected dimension 10 is larger than the x-axis projected dimension 8 of the Y-axis direction dicing street 6. Moreover, the stop island 4 whose y-axis projected dimension 9 is smaller than the y-axis projected dimension 7 of the X-axis direction dicing street 5 can prevent formation of a narrow void extending in the Y-axis direction between the stop island 4 and the element region 3.

When the other structures whose examples are described in the DESCRIPTION are appropriately added to the structure above, that is, the other structures in the DESCRIPTION which are not mentioned as the structure above are appropriately added, the same advantages can be produced.

According to Embodiments described above, the GaN thin film 2 (or the GaN thin film 32) is a crystalline semiconductor film with a wurtzite crystalline structure. In such a structure, the crystalline semiconductor film formed with a c-plane, that is, a (0001) plane as the principal surface has three cleavage planes orthogonal to the principal surface and each angled at 120 degrees. Thus, neither the X-axis direction dicing streets 5 nor the Y-axis direction dicing streets 6 coincides with the cleavage planes. Thus, failures caused by splits of the GaN thin film 2 can be reduced.

According to Embodiments described above, the cleavage planes of the GaN thin film 2 (or the GaN thin film 32) are parallel to an extension direction of the second axis (Y-axis). Since the cleavage planes of the GaN thin film 2 are parallel to the Y-axis direction in such a structure, a split in the GaN thin film 2 in the X-axis direction dicing street 5 can be effectively prevented. Moreover, the stop island 4 can effectively prevent the propagation of the split in the Y-axis direction dicing street 6 in the GaN thin film 2.

According to Embodiments described above, the SiC substrate 11 and the GaN thin film 2 (or the GaN thin film 32) have different lattice constants. Such a structure offers a wide choice of applicable substrates. For example, application of inexpensive substrates can reduce the cost of manufacturing semiconductor devices. When the GaN thin film 2 is formed on an upper surface of a substrate with a different lattice constant, the adhesion between the substrate and the GaN thin film 2 is reduced. Thus, the GaN thin film 2 tends to split. Even when the GaN thin film 2 is epitaxially grown by interposing a buffer layer for gradually matching the lattice constants between the substrate and the GaN thin film 2, the GaN thin film 2 has film stress according to the difference in lattice constant. Thus, the GaN thin film 2 tends to split. To address this, the stop islands 4 can effectively prevent the propagation of a probable split.

According to Embodiments described above, the substrate is the diamond substrate 41. In such a structure, the diamond substrate 41 higher in thermal conductivity can effectively transfer the heat generated in a semiconductor element to the heat sink attached to the lower surface of the diamond substrate 41. Consequently, a semiconductor device with high stability can be provided. In a semiconductor device to be fabricated by bonding the diamond substrate 41 with a smoothed upper surface to a semiconductor film (the GaN thin film 32) with a smoothed lower surface in a bonding method, the GaN thin film 32 tends to split in smoothing the GaN thin film 32. Furthermore, since the adhesion between the diamond substrate 41 and the GaN thin film 32 which have been bonded together is sometimes reduced, the dicing street tends to split. To address this, the stop islands 34 can effectively prevent the propagation of a probable split.

In a method for manufacturing a semiconductor device according to Embodiments described above, the GaN thin film 32 is formed on an upper surface of a substrate. Here, the substrate is, for example, one of the SiC substrate 11, the diamond substrate 41, and the Si substrate 44 (the substrate may be one of them for convenience in the following description). Then, the protective film 12 (or protective film 42) is formed on an upper surface of the GaN thin film 32. While the protective film 12 (or protective film 42) is partially removed to separate the protective film 12 into a plurality of the element regions 3 (or the element regions 33), the X-axis dicing streets 5 (or the X-axis direction dicing streets 35) extending along the first axis (X-axis) in a plan view are formed. While the protective film 12 (or protective film 42) is partially removed to separate the protective film 12 into the plurality of element regions 3 (or the element regions 33), the Y-axis dicing streets 6 (or the Y-axis direction dicing streets 36) extending along the second axis (Y-axis) in the plan view are formed. Then, each of the stop islands 4 is formed which is disposed on the upper surface of the GaN thin film 32 at an intersection between the X-axis direction dicing street 5 (or the X-axis direction dicing street 35) and the Y-axis dicing street 6 (or the Y-axis direction dicing street 36) and which is in non-contact with the element region 3 (or the element region 33). Here, assuming that X_si denotes a projected dimension of the stop island 4 (or stop island 34) to the first axis, Y_si denotes a projected dimension of the stop island 4 (or stop island 34) to the second axis, X_ds denotes a projected width of the Y-axis direction dicing street 6 (or the Y-axis direction dicing street 36) to the first axis, and Y_ds denotes a projected width of the X-axis direction dicing street 5 (or the X-axis direction dicing street 35) to the second axis, X_si>X_ds and Y_si<Y_ds are satisfied.

In such a structure, each of the stop islands 4 is disposed at the intersection between the X-axis direction dicing street 5 and the Y-axis direction dicing street 6. Thus, even when the GaN thin film 2 in the dicing streets splits, the propagation of the split is prevented at the position of the stop island 4. The relationship of X_si>X_ds and Y_si<Y_ds is satisfied while the stop islands 4 are separated from the element regions 3. Even when the semiconductor device is diced across the stop islands 4, peeling of the protective films 12 can be prevented from reaching the element regions 3. Particularly, the propagation of the split in the dicing street extending in the Y-axis direction can be effectively prevented.

When there is no particular limitation, the order of processes can be changed.

When the other structures whose examples are described in the DESCRIPTION are appropriately added to the structure above, that is, the other structures in the DESCRIPTION which are not mentioned as the structure above are appropriately added, the same advantages can be produced.

In the method for manufacturing a semiconductor device according to Embodiments described above, a supporting substrate is bonded to cover the protective film 42, the X-axis direction dicing streets 35, the Y-axis direction dicing streets 36, and the stop islands 34. Here, the supporting substrate is, for example, the glass supporting substrate 46. Then, a substrate is removed from the lower surface of the substrate. Here, the substrate is, for example, one of the SiC substrate 11 and the Si substrate 44 (the substrate may be one of them for convenience in the following description). A heat dissipation substrate is bonded to a lower surface of a buffer layer. The buffer layer is grown on the lower surface of the GaN thin film 32 after the Si substrate 44 is removed. Here, the buffer layer is, for example, the GaN-based buffer layer 47. Furthermore, the heat dissipation substrate is, for example, the diamond substrate 41. In such a structure, a substrate with high heat dissipation performance such as the diamond substrate 41 on which the GaN thin film 32 cannot be epitaxially grown is applicable as a substrate of a semiconductor device. Consequently, a semiconductor device with high heat dissipation performance can be provided. Each of the stop islands 34 can effectively prevent the propagation of a probable split in the GaN thin film 32 when the diamond substrate 41 with high heat dissipation performance is bonded to the GaN-based buffer layer 47.

[Modifications of Embodiments Above]

Although Embodiments described above specifies materials, dimensions, shapes, relative arrangement relationships, and conditions for implementation of each of the constituent elements, these are in all aspects examples and do not restrict the disclosure.

Therefore, numerous modifications and equivalents that have not yet been exemplified are devised within the scope of the technology disclosed in the DESCRIPTION. Examples of the numerous modifications and equivalents include a case where at least one constituent element is modified, added, or omitted, and further a case where at least one constituent element in at least one embodiment is extracted and combined with a constituent element in another embodiment.

When Embodiments above specify, for example, the name of a material without any particular designation, the material includes another additive, for example, an alloy unless it is contradictory.

Furthermore, the constituent element described as one element in Embodiments above may be more than one unless it is contradictory.

Furthermore, the constituent elements in Embodiments above are conceptual units. The scope of the technology disclosed in the DESCRIPTION covers one constituent element comprising a plurality of structures, one constituent element corresponding to a part of a structure, and a plurality of constituent elements included in one structure.

Furthermore, each of the constituent elements in Embodiments above includes another structure or a structure having a shape, as long as it fulfills the same function.

The DESCRIPTION is referred to for all the objectives of the present technology, and is not regarded as prior art.

EXPLANATION OF REFERENCE SIGNS

1, 31 semiconductor device, 2, 32 GaN thin film, 3, 33 element region, 4, 18, 19, 34 stop island, 5, 35 X-axis direction dicing street, 6, 36 Y-axis direction dicing street, 7, 9, 37, 39 y-axis projected dimension, 8, 10, 38, 40 x-axis projected dimension, 11 SiC substrate, 12, 42 protective film, 13, 43 dicing street, 14, 15, 16 cleavage plane, 17, 20, 21, 22 split, 41 diamond substrate, 44 Si substrate, 45 resin layer, 46 glass supporting substrate, 47 GaN-based buffer layer.

The invention claimed is:

1. A semiconductor device, comprising:
   a semiconductor film formed on an upper surface of a substrate;
   a plurality of protective films partially formed on an upper surface of the semiconductor film;
   a first dicing street passing between a plurality of element regions on which the plurality of protective films are respectively formed, the first dicing street extending along a first axis in a plan view;
   a second dicing street passing between the plurality of element regions and extending along a second axis crossing the first axis in the plan view; and
   a stop island disposed directly on the upper surface of the semiconductor film at an intersection between the first dicing street and the second dicing street, the stop island being in non-contact with the plurality of element regions,
   wherein assuming that X_si denotes a projected dimension of the stop island in an extension direction of the first axis,
   Y_si denotes a projected dimension of the stop island in an extension direction of the second axis,
   X_ds denotes a projected width of the second dicing street in the extension direction of the first axis, and
   Y_ds denotes a projected width of the first dicing street in the extension direction of the second axis,
   X_si>Y_si, X_si>X_ds and Y_si<Y_ds are satisfied,
   the semiconductor film is a crystalline semiconductor film with a wurtzite crystalline structure, and
   cleavage planes of the semiconductor film are orthogonal to the extension direction of the first axis.

2. The semiconductor device according to claim 1,
   wherein cleavage planes of the semiconductor film are parallel to the extension direction of the second axis.

3. The semiconductor device according to claim 2,
   wherein the substrate and the semiconductor film have different lattice constants.

4. The semiconductor device according to claim 2,
   wherein the substrate is a diamond substrate.

5. The semiconductor device according to claim 1,
   wherein the substrate and the semiconductor film have different lattice constants.

6. The semiconductor device according to claim 5,
   wherein the substrate is a diamond substrate.

7. The semiconductor device according to claim 1,
   wherein the substrate is a diamond substrate.

8. A method for manufacturing the semiconductor device according to claim 1, the method comprising:

forming the semiconductor film on the upper surface of the substrate;

forming a preliminary protective film on the upper surface of the semiconductor film;

partially removing the preliminary protective film to separate the preliminary protective film into the plurality of protective films, and forming the first dicing street extending along the first axis in the plan views and the second dicing street extending along the second axis crossing the first axis in the plan view; and forming the stop island disposed on the upper surface of the semiconductor film at the intersection between the first dicing street and the second dicing street.

9. The method according to claim 8, further comprising:

bonding a supporting substrate to cover the protective film, the first dicing street, the second dicing street, and the stop island;

removing the substrate from a lower surface of the substrate; and bonding a heat dissipation substrate to a lower surface of a buffer layer, the buffer layer being grown on a lower surface of the semiconductor film after the removing of the substrate.

10. The semiconductor device according to claim 1, wherein the stop island is formed of a same material as the plurality of protective films.

11. The semiconductor device according to claim 10, wherein the plurality of protective films and the stop island each include SiN.

12. The semiconductor device according to claim 1, wherein the semiconductor film includes GaN.

13. The semiconductor device according to claim 1, wherein the stop island is at a same level as the plurality of protective films, as measured from the upper surface of the substrate.

14. The semiconductor device according to claim 1, wherein the stop island is on a same layer as the plurality of protective films.

* * * * *